United States Patent
Verma et al.

(10) Patent No.: US 7,725,868 B1
(45) Date of Patent: May 25, 2010

(54) METHOD AND APPARATUS FOR FACILITATING SIGNAL ROUTING WITHIN A PROGRAMMABLE LOGIC DEVICE

(75) Inventors: Vinay Verma, Cupertino, CA (US);
Anirban Rahut, San Jose, CA (US);
Sudip K. Nag, San Jose, CA (US);
Jason H. Anderson, Toronto (CA);
Rajeev Jayaraman, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 237 days.

(21) Appl. No.: 11/983,550

(22) Filed: Nov. 9, 2007

Related U.S. Application Data (62) Division of application No. 10/651,808, filed on Aug. 29, 2003, now Pat. No. 7,306,977.

(51) Int. Cl.
*G06F 17/50* (2006.01)
*H03K 17/693* (2006.01)

(52) U.S. Cl. .............................. 716/16; 716/12; 716/13; 716/14

(58) Field of Classification Search ............. 716/12–14, 716/16, 17
See application file for complete search history.

(56) References Cited

U.S. PATENT DOCUMENTS

| | | | |
|---|---|---|---|
| 6,014,509 A | 1/2000 | Furtek et al. | |
| 6,175,950 B1 * | 1/2001 | Scepanovic et al. | ........... 716/13 |
| 6,442,743 B1 * | 8/2002 | Sarrafzadeh et al. | .......... 716/10 |
| 6,501,297 B1 | 12/2002 | Kong | |
| 6,507,941 B1 | 1/2003 | Leung et al. | |
| 6,738,961 B2 | 5/2004 | Snider | |
| 6,747,482 B2 | 6/2004 | Ting | |
| 6,886,149 B1 | 4/2005 | Teig et al. | |
| 6,915,361 B2 | 7/2005 | Alpert et al. | |
| 7,051,313 B1 * | 5/2006 | Betz et al. | ..................... 716/17 |
| 2001/0018759 A1 | 8/2001 | Andreev et al. | |
| 2002/0163357 A1 | 11/2002 | Ting | |
| 2003/0121017 A1 | 6/2003 | Andreev et al. | |
| 2004/0017222 A1 | 1/2004 | Betz et al. | |
| 2004/0098696 A1 | 5/2004 | Teig et al. | |

OTHER PUBLICATIONS

U.S. Appl. No. 10/651,808, filed Aug. 29, 2003, Verma, Vinay et al., "Method and Apparatus for Facilitating Signal Routing Within a Programmable Logic Device", 28 pages, available from Xilinx Inc., 2100 Logic Drive, San Jose, CA 95124.

* cited by examiner

*Primary Examiner*—Thuan Do
*Assistant Examiner*—Nha T Nguyen
(74) *Attorney, Agent, or Firm*—W. Eric Webostad; Robert M. Brush; Lois D. Cartier (57) ABSTRACT

Method and apparatus for facilitating signal routing within a programmable logic device having routing resources is described. In an example, the routing resources are formed into groups where, for each of the groups, the routing resources are of a same type. Pairs of the groups are related by an association of at least one routing resource in one group of a pair of groups capable of being electrically connected to at least one other routing resource in another group of the pair of groups.

2 Claims, 8 Drawing Sheets

METHOD AND APPARATUS FOR FACILITATING SIGNAL ROUTING WITHIN A PROGRAMMABLE LOGIC DEVICE

FIELD OF THE INVENTION

One or more aspects of the present invention relate generally to signal routing within a programmable logic device and, more particularly, to facilitating signal routing within a programmable logic device by employing a global routing graph.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, called a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a hierarchy of programmable routing resources, which are comprised of metal wire segments and programmable routing switches, also referred to as programmable interconnection points (PIPs). These CLBs, IOBs, and programmable routing resources are customized by loading a stream of configuration data (bitstream) into internal configuration memory cells that define how the CLBs, IOBs, and programmable routing resources are configured. The configuration bitstream may be read from an external memory, conventionally an external integrated circuit memory EEPROM, EPROM, PROM, and the like, though other types of memory may be used. The collective states of the individual memory cells then determine the function of the FPGA.

State-of-the art FPGAs contain tens of thousands of CLBs. For such devices, the task of establishing the required interconnections between the primitive cells inside a CLB and between the CLBs themselves becomes so onerous that it can only be accomplished with the assistance of computer-aided design tools. Accordingly, the manufacturers of FPGAs have developed place and route software tools which may be used by end customers to implement their respective designs in their FPGAs.

During the placement phase, primitive cells within the FPGA are assigned physical positions on the chip. In the routing phase, a suitable path between components that are to be connected is established using wires and switches. Finding the optimum routing solution within an FPGA is "non-polynomial-hard" or "NP-hard". Notably, some routing algorithms that are used to route signals within a programmable logic device, such as an FPGA, employ a "routing graph" to model the programmable routing resources. For example, a widely used algorithm used for routing signals using a routing graph is a variant form of the well-known maze router. A routing graph contains a set of nodes and directed edges. The nodes in the routing graph represent conductors in the programmable logic device. Edges are present between nodes corresponding to conductors that can be electrically connected to one another. For example, in FPGA devices, edges are present between nodes corresponding to conductors that may be connected to each other through a programmable routing switch.

A signal in a design is a set of pins that must be connected together electrically. A signal is generally comprised of a source pin and one or more load pins. The pins on a signal correspond to specific nodes in the routing graph. To route a signal, the router identifies paths between the signal's pin nodes in the routing graph such that all the pins of the signal are connected together. For example, the maze router algorithm searches for a path between a signal source pin and load pins by performing a breadth first search on the routing graph.

Conventionally, a routing graph includes a node for each conductor and an edge for each pair of conductors that may be electrically connected through a PIP. Such a routing graph is referred to herein as a "detailed routing graph". A detailed routing graph that models the programmable interconnect of an FPGA may include millions of nodes and even more edges between nodes. As such, routing a signal using a detailed routing graph may become particularly onerous and time-consuming.

Accordingly, there exists a need in the art for a signal routing mechanism that overcomes the complexities associated with the use of a detailed routing graph.

SUMMARY OF THE INVENTION

An aspect of the invention is a method and apparatus for facilitating signal routing within a programmable logic device having routing resources. In an embodiment, the routing resources are formed into groups where, for each of the groups, the routing resources are of a same type. In an embodiment, routing resources are of a same type if the routing resources have the same length, the same orientation, and the same start and end programmable routing switches. Pairs of the groups are related by an association of at least one routing resource in one group of a pair of groups capable of being electrically connected to at least one other routing resource in another group of the pair of groups.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for facilitating signal routing within a programmable logic device is described. One or more aspects in accordance with the invention are described in terms of routing signals within a field programmable gate array (FPGA). While specific reference is made to an FPGA, those skilled in the art will appreciate that one or more aspects of the invention may be used to route signals in other types of integrated circuits that have a segmented interconnect architecture, such as complex programmable logic devices (CPLDs).

Figure 1:
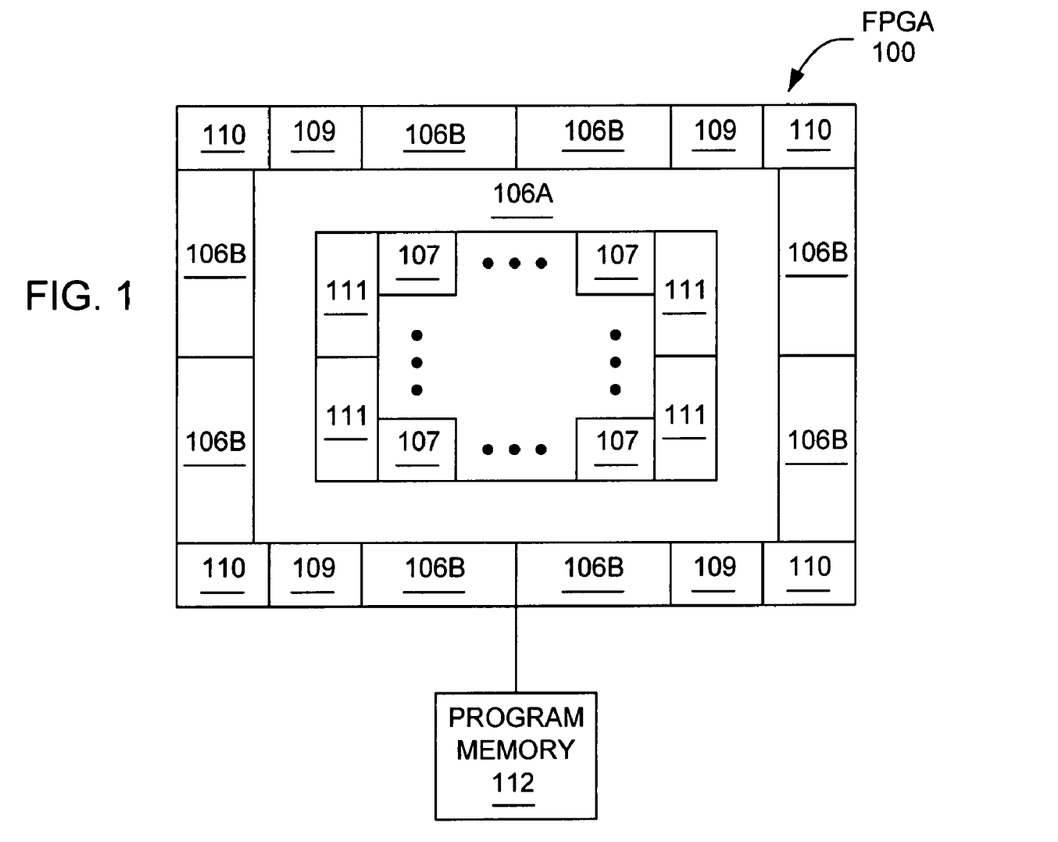
FIG. 1 is a block diagram depicting an exemplary embodiment of a field programmable gate array (FPGA) coupled to a program memory.

FIG. 1 depicts a block diagram of an exemplary embodiment of a field programmable gate array (FPGA) 100 coupled to a program memory 112. FPGA 100 illustratively includes CLBs 107, I/O routing ring 106A ("programmable interconnect"), memory 111, such as random access memory, delay lock loop (DLL) blocks 109, multiply/divide/de-skew clock circuits 110, and programmable IOBs 106B. DLL blocks 109 and clock circuits 110 collectively provide digital clock management (DCM) circuits for managing clock signals within FPGA 100. FPGA 100 may include other types of logic blocks and circuits in addition to those described herein.

CLBs 107 are programmably connectable to each other, to the I/O routing ring 108, and to other types of circuit blocks for performing various types of logic functions. Each of CLBs 107 may include one or more "slices" and programmable interconnect circuitry (not shown). Each CLB slice in turn includes various circuits, such as flip-flops, function generators (e.g., look-up tables (LUTs)), logic gates, memory, and like type well-known circuits.

Programmable IOBs 106B are configured to provide input to, and receive output from, one or more of CLBs 107 or other circuit blocks. Configuration information for CLBs 107, I/O routing ring 106A, and programmable IOBs 106B is stored in memory 111. Briefly stated, a configuration bitstream produced from program memory 112 is coupled to a configuration port of FPGA 100 to implement a desired circuit therein. Each of CLBs 107, I/O routing ring 106A, and programmable IOBs 106B are generally referred to herein as "programmable logic blocks".

Figure 2:
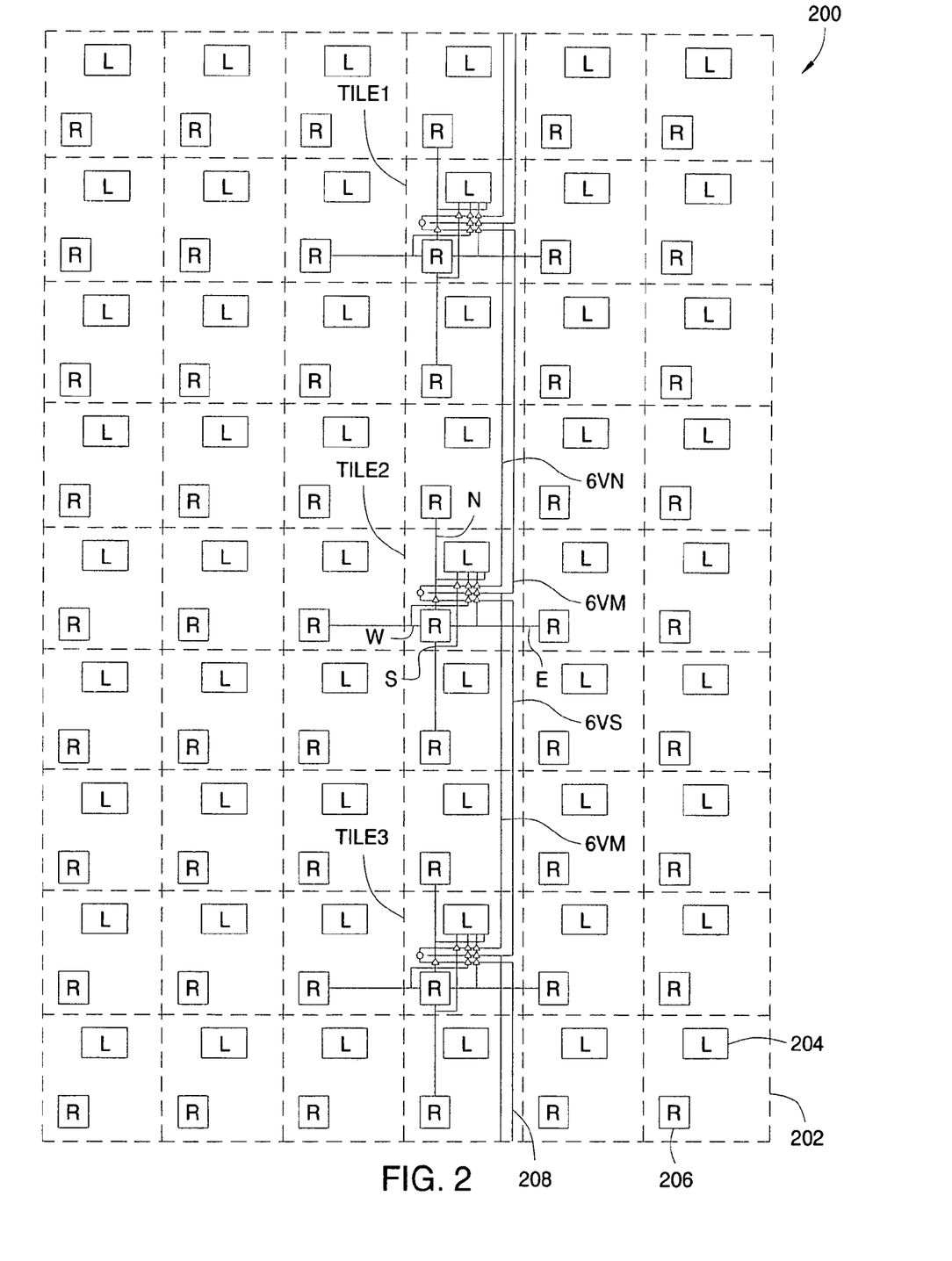
FIG. 2 is a schematic diagram depicting an exemplary embodiment of a portion of an FPGA.

FIG. 2 is a schematic diagram depicting an exemplary embodiment of a portion 200 of an FPGA. Portion 200 includes an array of tiles 202. Each of tiles 202 includes a logic block 204 and a routing or switching structure ("programmable routing switch") 206. Each of tiles 202 further includes routing resources 208. In an embodiment, routing resources 208 are conductors formed from wire segments that connect to other wire segments in other tiles. For purposes of clarity by example, most of routing resources 208 in portion 200 are not shown.

Three of tiles 202, labeled TILE1, TILE2, and TILE3, are shown in more detail. In addition, routing resources 208 extending from TILE1, TILE2, and TILE3 are shown. Programmable connections are provided using programmable interconnection points (PIPs) within programmable routing switches 206. Each of PIPs may include at least one transistor for selectively coupling one wire segment to another wire segment within routing resources 208.

Notably, portion 200 may be viewed as a collection of logic and routing resources organized in a regular tiled fashion. Each tile (a region of logic and routing resources) is replicated as needed on the device. Each routing resource may span one or more such tiles. For example, the routing resources labeled N, E, S and W span one tile, while the routing resources labeled 6VM, 6VN and 6VS span more than three tiles. Each routing resource's topology is precisely defined by the set of tiles that it spans. From these tiles, the routing resource length can be computed by recording the number of the tiles that the routing resource intersects.

Note that a user may define a topology within a programmable logic device, such as portion 200, to be different from the physical architecture of the resources. For example, another user may desire to use a topology such that a group of four adjacent tiles 202 is considered one unit. Alternatively, a third user may subdivide tiles 202 into a number of sub-units. As used herein, a topology unit is considered as a unit of measurement. In an embodiment, the topology comprises a plurality of rectangular or square topology units. A given routing resource may span one or more topology units. Examples of routing resources include routing resource connected to adjacent tiles, routing resources spanning two tiles ("double lines"), routing resources spanning six tiles ("hex lines"), and routing resources spanning the entire device ("long lines").

Figure 3:
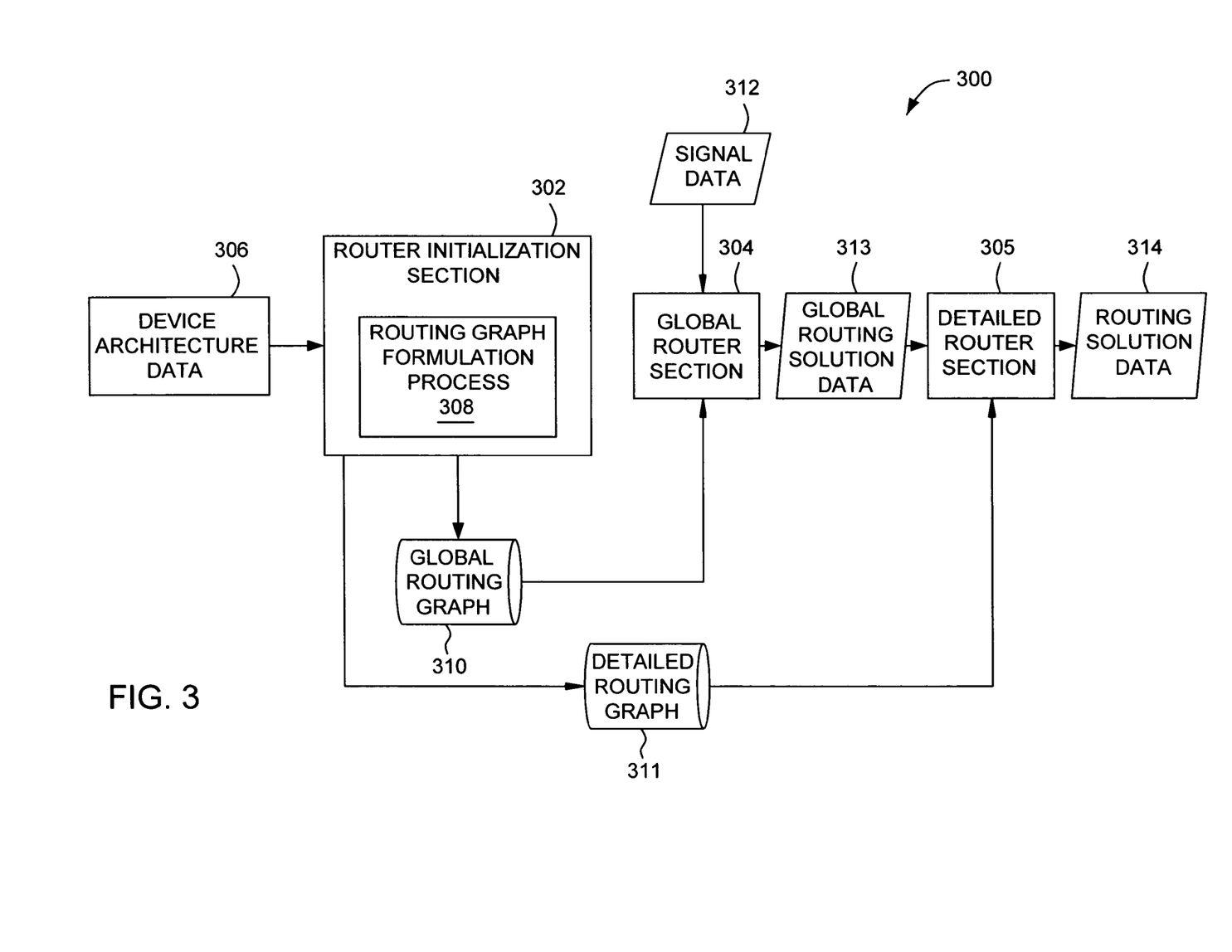
FIG. 3 is a block diagram depicting an exemplary embodiment of a system for routing a signal within a programmable logic device.

FIG. 3 is a block diagram depicting an exemplary embodiment of a system 300 for routing a signal within a programmable logic device. System 300 includes a router initialization section 302, a global router section 304, and a detailed router section 305. An input of router initialization section 302 receives device architecture data for an integrated circuit, such as an FPGA and the like. As described above, FPGAs may include an array of tiles having routing resources of different lengths and orientations within the device. Router initialization section 302 executes a global routing graph formulation process 308 using device architecture data 306 to produce a global routing graph 310. An exemplary embodiment of global routing graph formulation process 308 is described below with respect to FIG. 4. Router initialization section 302 also produces a detailed routing graph 311. As described above, a detailed routing graph includes a node for each conductor in the device, and an edge for each pair of conductors that may be electrically connected through a PIP in the device. As described below, global routing graph 310 includes far less nodes and edges than detailed routing graph 311. This allows for quicker determination of an optimal routing solution.

An input of global router section 304 receives data corresponding to signals that are to be routed within the FPGA ("signal data" 312), as well as global routing graph data 310. Global router section 304 routes signals in accordance with signal data 312 using global routing graph 310. For example, global router section 304 may employ a maze-router algorithm, as described above. Global router section 304 produces global routing solution data 313.

An input of detailed router section 305 receives global routing solution data 313, as well as detailed routing graph 311. Detailed router section 305 routes signals in accordance with global routing solution data 313 using detailed routing graph 311. Notably, detailed router section 305 may execute a maze-router algorithm on detailed routing graph 311 that is initialized using global routing solution data 313. That is, global routing solution data 313 is used to reduce the search space within the detailed routing graph 311. As described above, routing signals using a detailed routing graph alone may become particularly onerous and time-consuming. By initializing the detailed routing process using the results of global router section 304, signal routing using the detailed routing graph is less time-consuming.

Figure 4:
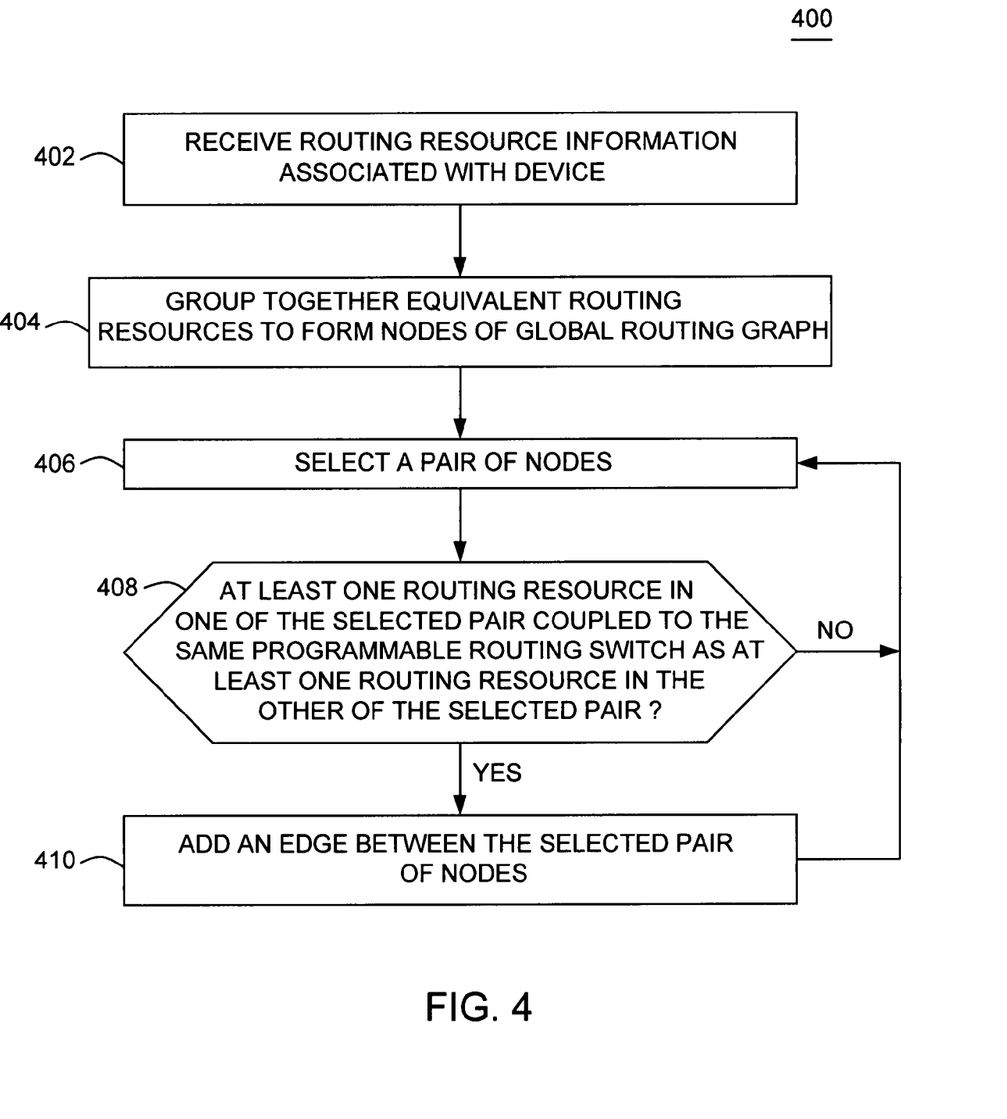
FIG. 4 is a flow diagram depicting an exemplary embodiment of routing graph formulation process.

FIG. 4 is a flow diagram depicting an exemplary embodiment of global routing graph formulation process 308. Process 308 begins at step 402, where routing resource information associated with the programmable logic device is received. Routing resource information includes the routing resource architecture of the programmable logic device (e.g., the length and orientation of the various routing resources of the device). At step 404, equivalent routing resources are grouped together to form nodes of a routing graph. In an embodiment, equivalent routing resources are routing resources that have the same structure (i.e., span the same number of topology units within the device), start and end with the same programmable routing switch, and have the same orientation (e.g., horizontal or vertical).

At step 406, a pair of nodes formed in step 404 are selected. At step 408, a determination is made as to whether at least one routing resource in one of the selected pair of routing resources is coupled to the same programmable routing switch as at least one routing resource in the other of the selected pair of routing resources. If not, process 308 returns to step 406, where another pair of nodes is selected. Otherwise, process 308 proceeds to step 410, where an edge between the selected pair of nodes is added to the routing graph. Process 308 then returns to step 406, where another pair of nodes is selected.

Figure 9:
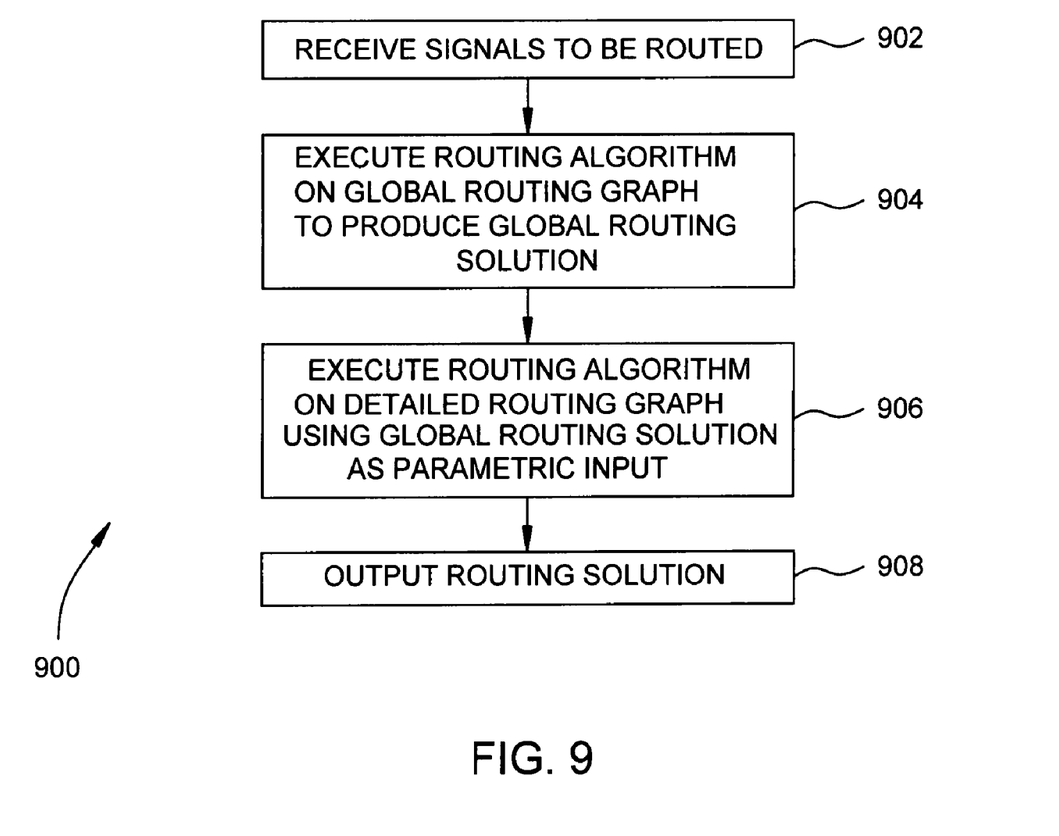
FIG. 9 is a flow diagram depicting an exemplary embodiment of a process for routing signals within a programmable logic device.

FIG. 9 is a flow diagram depicting an exemplary embodiment of a process 900 for routing signals within a programmable logic device. Process 900 begins at step 902, where signal data is received indicative of the signals to be routed. At step 904, a routing algorithm is executed on a global routing graph associated with the programmable logic device to produce a global routing solution. At step 906, a routing algorithm is executed on a detailed routing graph associated with the programmable logic device using the global routing solution of step 904 as parametric input. At step 908, a routing solution corresponding to the signal data is produced for the programmable logic device.

Figure 5:
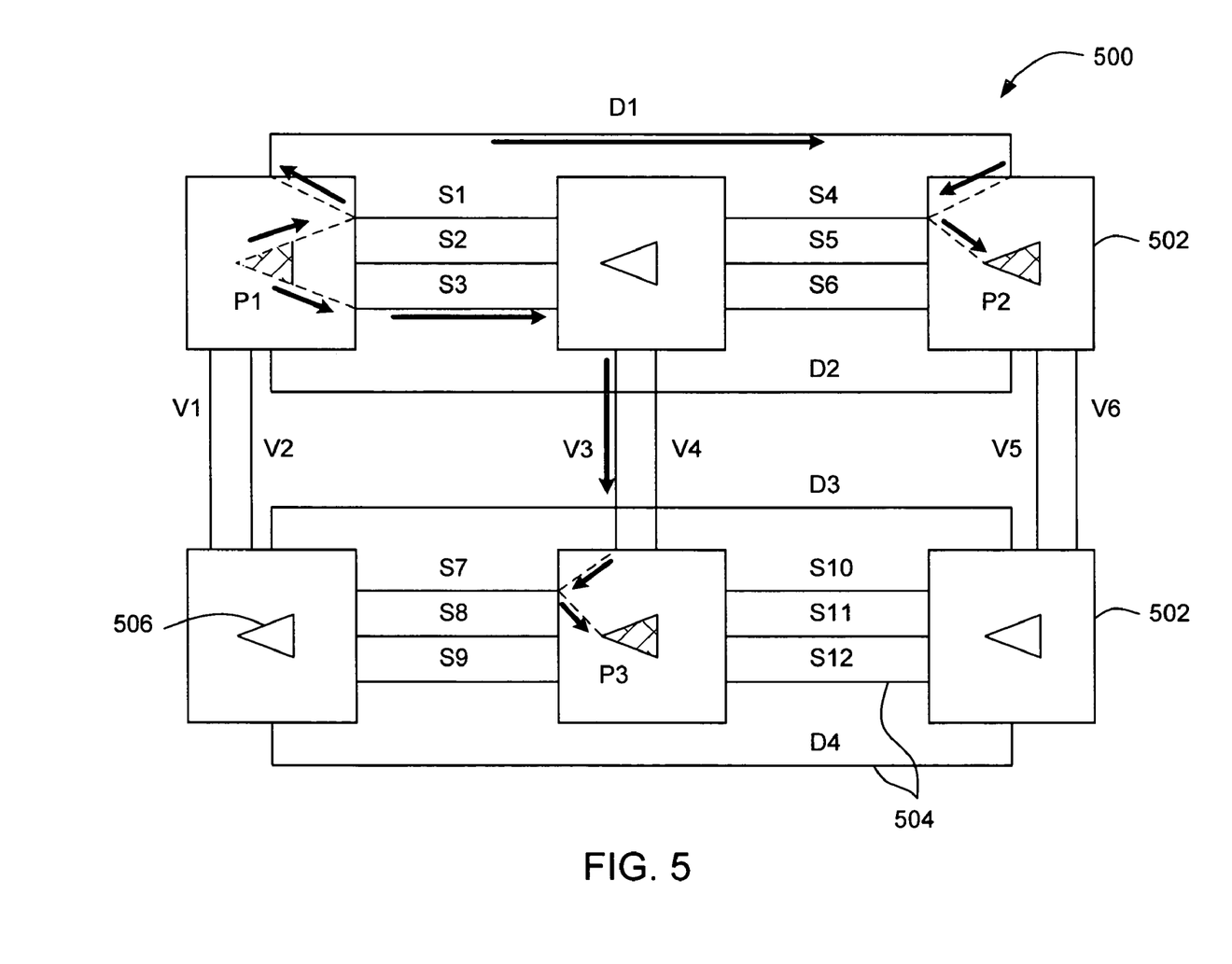
FIG. 5 is a block diagram depicting another exemplary embodiment of a portion of an FPGA.

The processes described above may be more thoroughly understood with reference to the following example. FIG. 5 is a block diagram depicting an exemplary embodiment of a portion 500 of an FPGA. Portion 500 includes programmable routing switches 502 and routing resources 504. Routing resources 504 include double-length wire segments designated with reference characters d1 through d4; horizontal single-length wire segments designated with reference characters s1 through s12; and vertical single-length wire segments designated with reference characters v1 through v6. Each of the programmable routing switches 502 includes a pin 506. Three of pins 506 are designated as P1, P2, and P3. Pins 506 are shown internal to routing switches 502. For clarity, connections between pins and wire segments are not shown in FIG. 5. In this example, it is assumed that pins may only connect to single-length wire segments.

Figure 6:
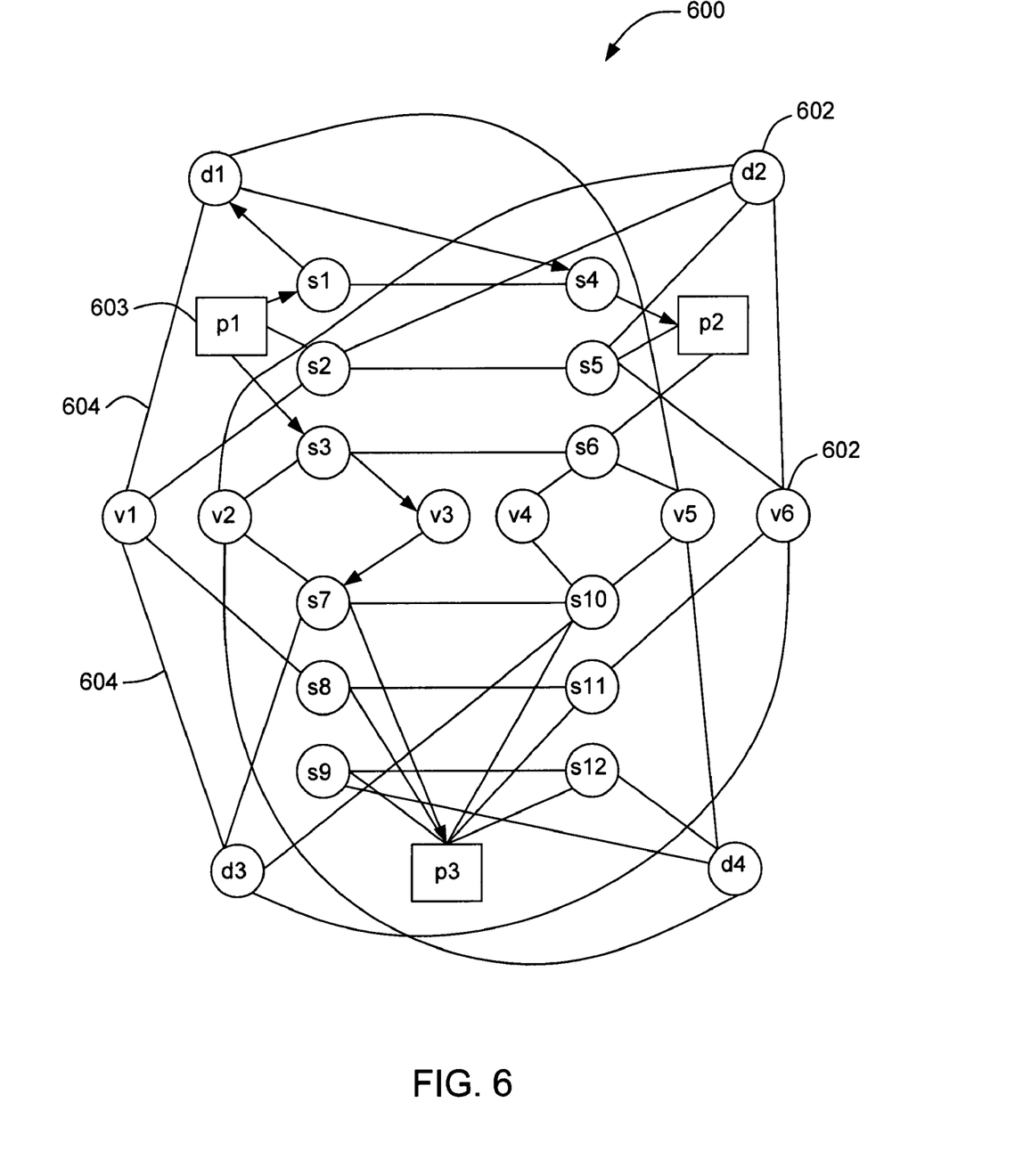
FIG. 6 is a detailed routing graph depicting an exemplary routing solution using the portion of FIG. 5.

In the present example, pin P3 is to be connected to pin P1, and pin P2 is to be connected to pin P1. FIG. 6 is a detailed routing graph 600 depicting an exemplary routing solution using portion 500 of FIG. 5. Routing graph 600 may be represented as GD(V,E), where V is a set of nodes 602 and pins 603, respectively, representing the routing resources 504 and pins 506, and E is a set of edges 604 representing programmable routing switches 502 that connect the routing resources 504. The routing solution in the present example may be represented by a directed acyclic graph ("DAG"). Notably, pin P3 may be connected to pin P1 through nodes s3, v3 and s7 of graph 600. Pin P2 may be connected to pin P1 through nodes s1, d1, and s4 of graph 600. The DAG of this exemplary routing solution is shown by bold arrows, which start at pin P1 and end at pins P2 and P3.

Figure 7:
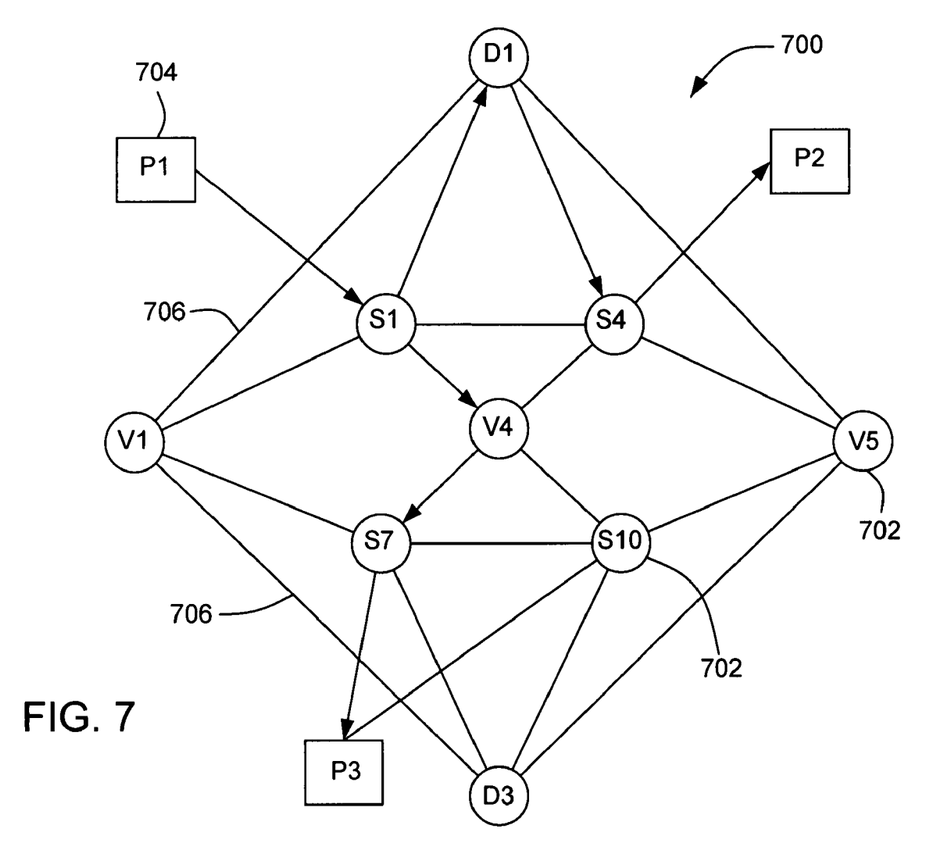
FIG. 7 is a global routing graph depicting an exemplary routing solution using the portion of FIG. 5.

As described above, a global routing graph is used to reduce the search space within the detailed routing graph when routing signals. FIG. 7 is a global routing graph 700 depicting an exemplary global routing solution using portion 500 of FIG. 5. Global routing graph 700 may be represented as GH(V',E'), where V' is a set of super-nodes 702 and pins 704, and E' is a set of global routing edges 706. A "super-node" is a group of equivalent routing resources 504. In an embodiment, a super-node is a collection of routing resources 504 that have the same structure (e.g., double-length wire segments have the same structure), start and end in the same programmable routing switches 502, and have the same orientation (e.g., horizontal or vertical). A global routing edge exists between a pair of super-nodes 702 if there is a programmable routing switch between at least one resource in one of the super-nodes and at least one resource in the other of the super-nodes.

In the present example, super-node S1 is a set of single-length wire segments s1, s2, and s3. Super node S4 is a set of single-length wire segments s4, s5, and s6. Since there is a programmable routing switch between at least one wire segment in super-node S1 and at least one wire segment in super-node S4, a global routing edge exists between super-node S1 and super-node S4. The DAG of the global routing solution for the present example is shown by bold arrows.

Given the DAG within global routing graph 700, a routing algorithm may be more efficiently performed on detailed routing graph 600. For example, in global routing graph 700, the connection between pin P1 and pin P3 traverses super-nodes S1, V4, and S7. Super-node S1 contains nodes s1, s2, and s3; super node V3 contains nodes v2 and v4; and super-node S7 contains nodes s7, s8, and s9. As such, the search space within detailed routing graph 600 may be reduced to just those nodes represented by the super-nodes within the DAG of global routing graph 700. For example, to physically connect pin P1 and pin P3 within portion 500, a connection may traverse nodes s3 (a node within super-node S1), v3 (a node within super-node V4), and s7 (a node within super-node S7). Such a connection is illustrated by the DAG of detailed routing graph 600.

Since each of the super-nodes in the global routing graph includes equivalent routing resources, the global routing graph incorporates precise timing information. In addition, as illustrated with reference to FIG. 7 above, there are significantly less nodes and edges in the global routing graph than are present in the detailed routing graph. FPGAs may be designed to have various sets of equivalent routing resources in a multi-segmented architecture. The more routing resources that can be grouped together in the super-nodes of the global routing graph, the smaller the global routing graph will be when compared to the detailed routing graph. For example, in an FPGA, a global routing graph may have as much as 96% less nodes than a corresponding detailed routing graph, and as much as 99% less edges. Moreover, the global routing graph captures all possible detailed routing solutions. That is, if a solution cannot be found in the global routing graph, then such a solution cannot be found in a detailed routing graph.

Figure 8:
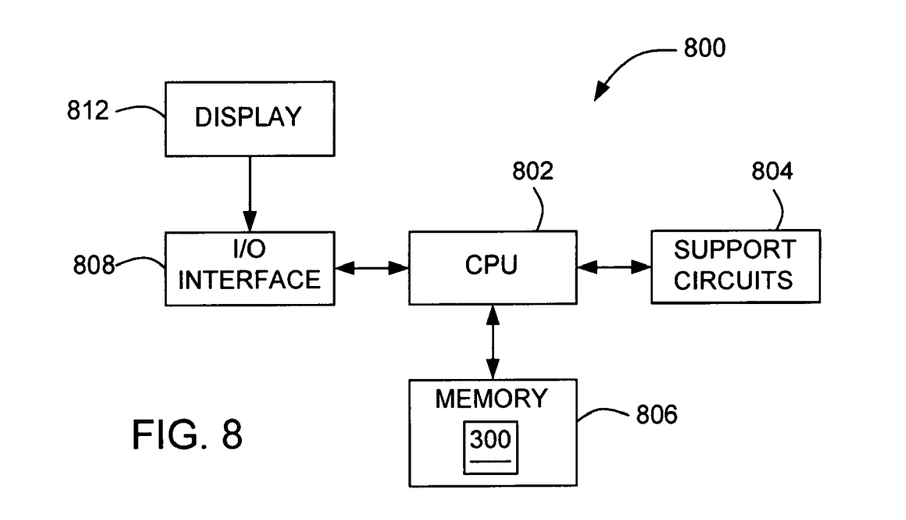
FIG. 8 depicts a block diagram showing an exemplary embodiment of a computer system suitable for implementing processes and methods described herein.

FIG. 8 depicts a block diagram showing an exemplary embodiment of a computer system 800 suitable for implementing processes and methods described herein. Computer system 800 includes a central processing unit (CPU) 802, memory 806, a variety of support circuits 804, and an I/O interface 808. CPU 802 may be any type of microprocessor known in the art. Support circuits 804 for CPU 802 include conventional cache, power supplies, clock circuits, data registers, I/O interfaces, and the like. I/O interface 808 may be directly coupled to memory 806 or coupled through CPU 802, and may be coupled to a conventional keyboard, network, mouse, printer, and interface circuitry adapted to receive and transmit data, such as data files and the like. I/O interface 808 may be coupled to a display 812.

Memory 806 may store all or portions of one or more programs or data to implement the processes and methods of the invention. Although exemplary embodiments of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as application specific integrated circuits (ASICs).

Computer system 800 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in memory 806. Memory 806 may include one or more of the following: random access memory, read only memory, magneto-resistive read/write memory, optical read/write memory, cache memory, magnetic read/write memory, and the like, as well as signal-bearing media as described below. Memory 806 may store all or a portion of system 300 of FIG. 3.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

Method and apparatus for facilitating signal routing within an integrated circuit has been described. One or more aspects of the invention relate to the generation of a "global routing graph" for routing signals. In an embodiment, super-nodes of the global routing graph include a collection of equivalent routing resources. The global routing graph provides the ability to perform timing-driven global routing, since the super-nodes include equivalent routing resources. Moreover, the global routing graph is significantly smaller than a detailed routing graph.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof.

Claim(s) listing steps do not imply any order of the steps. Trademarks are the property of their respective owners.

The invention claimed is:

1. A system for routing a signal within a programmable device, the system comprising:
    a processing unit having access to one or more storage devices;
    at least a portion of the one or more storage devices having topology data and routing resource data associated with the programmable device; and
    at least another portion of the one or more storage devices having a program product configured to:
        form routing resources of the routing resource data into groups where, for each of the groups, the routing resources are of a same type based at least in part on the topology data;
        form a global routing graph by relating pairs of groups by an association of at least one routing resource in one group of a pair of groups capable of being electrically connected to at least one other routing resource in another group of the pair of groups;
        form a detailed routing graph by relating individual ones of the routing resources; and
        reduce a search space within the detailed routing graph using the global routing graph to route a signal from a source routing resource to a destination routing resource,
    wherein the programmable device is divided into topology units, and
    wherein the routing resources of each of the groups traverse a same number of topology units, have a same orientation, and have a same source and destination within the programmable device.

2. A processor-based system for routing a signal within an programmable device having routing resources, the system comprising:
    a router initialization section for forming the routing resources into groups where, for each of the groups, the routing resources are of a same type, for forming a global routing graph by relating pairs of groups by an association of at least one routing resource in one group of a pair of groups capable of being electrically connected to at least one other routing resource in another group of the pair of groups, and for forming a detailed routing graph by relating individual ones of the routing resources;
    a router section for reducing a search space within the detailed routing graph using the global routing graph to determine a signal path from a source routing resource to a destination; and
    a database for storing topology data associated with the programmable device,
    wherein the routing resources of each of the groups traverse a same number of topology units of the topology data, have a same orientation, and have a same source and destination within the programmable device,
    wherein the router initialization section and the router section are stored on the processor-based system and executable by the processor-based system.

* * * * *